US009905444B2

(12) United States Patent
Ranish

(10) Patent No.: US 9,905,444 B2
(45) Date of Patent: Feb. 27, 2018

(54) OPTICS FOR CONTROLLING LIGHT TRANSMITTED THROUGH A CONICAL QUARTZ DOME

(71) Applicant: Joseph M. Ranish, San Jose, CA (US)

(72) Inventor: Joseph M. Ranish, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1183 days.

(21) Appl. No.: 13/785,539

(22) Filed: Mar. 5, 2013

(65) Prior Publication Data

US 2013/0284095 A1 Oct. 31, 2013

Related U.S. Application Data

(60) Provisional application No. 61/637,998, filed on Apr. 25, 2012, provisional application No. 61/662,166, filed on Jun. 20, 2012.

(51) Int. Cl.
*G02B 17/00* (2006.01)
*H01L 21/02* (2006.01)
*H01L 21/67* (2006.01)

(52) U.S. Cl.
CPC ...... *H01L 21/67115* (2013.01); *G02B 17/002* (2013.01); *H01L 21/02104* (2013.01)

(58) Field of Classification Search
CPC ..... C23C 16/48; C23C 16/481; C23C 16/482; H01L 21/02104; H01L 21/67098; H01L 21/67109; H01L 21/67115; G02B 17/002; G02B 17/006
See application file for complete search history.

(56) References Cited

U.S. PATENT DOCUMENTS

| 4,806,289 A | 2/1989 | Laursen et al. |
| 5,662,469 A * | 9/1997 | Okase ................ C23C 16/4583 |
| | | 257/E21.101 |
| 5,884,009 A * | 3/1999 | Okase ............... H01L 21/67115 |
| | | 219/405 |

(Continued)

FOREIGN PATENT DOCUMENTS

| CN | 1529900 A | 9/2004 |
| JP | H08-45863 A | 2/1996 |

(Continued)

OTHER PUBLICATIONS

International Search Report dated May 30, 2013 for Application No. PCT/US2013/029344.

(Continued)

*Primary Examiner* — Benjamin Kendall
(74) *Attorney, Agent, or Firm* — Patterson + Sheridan, LLP

(57) ABSTRACT

Embodiments described herein generally relate to apparatus for heating substrates. The apparatus generally include a process chamber having a substrate support therein. A plurality of lamps is positioned to provide radiant energy through an optically transparent dome to a substrate positioned on the substrate support. A light focusing assembly is positioned within the chamber to influence heating and temperature distribution on the substrate and to facilitate formation of a film on a substrate having uniform properties, such as density. The light focusing assembly can include one or more reflectors, light pipes, or refractive lenses.

14 Claims, 9 Drawing Sheets

(56) References Cited

U.S. PATENT DOCUMENTS

| | | | |
|---|---|---|---|
| 5,902,033 A | 5/1999 | Levis et al. | |
| 6,108,491 A | 8/2000 | Anderson | |
| 6,121,579 A | 9/2000 | Aoki et al. | |
| 6,476,362 B1* | 11/2002 | Deacon | H01L 21/67115 118/50.1 |
| 7,691,204 B2 | 4/2010 | Chacin et al. | |
| 2002/0030047 A1* | 3/2002 | Shao | C23C 16/481 219/390 |
| 2004/0108219 A1 | 6/2004 | Matsumura et al. | |
| 2004/0112885 A1* | 6/2004 | Shigeoka | H01L 21/67115 219/388 |
| 2004/0163599 A1 | 8/2004 | Hayashide et al. | |
| 2007/0232031 A1 | 10/2007 | Singh et al. | |
| 2008/0072820 A1* | 3/2008 | Burrows | H01L 21/67115 118/642 |
| 2009/0291566 A1* | 11/2009 | Ueno | C23C 16/463 438/758 |
| 2010/0111511 A1* | 5/2010 | Merry | C23C 16/481 392/411 |
| 2011/0052159 A1* | 3/2011 | Su | H01L 21/67115 392/411 |
| 2011/0121503 A1 | 5/2011 | Burrows et al. | |
| 2012/0145697 A1* | 6/2012 | Komatsu | H01L 21/68792 219/438 |
| 2012/0181265 A1* | 7/2012 | Menard | F27B 9/066 219/388 |

FOREIGN PATENT DOCUMENTS

| | | |
|---|---|---|
| JP | 2002-529911 A | 9/2002 |
| JP | 2004186495 A | 7/2004 |
| JP | 2004-259964 A | 9/2004 |
| KR | 10-0430947 | 6/2004 |
| WO | 00/26946 A1 | 5/2000 |

OTHER PUBLICATIONS

Chinese Office Action dated Jun. 7, 2016 for Application No. 201380018920.X.

Chinese Office Action dated Dec. 15, 2016 for Application No. 201380018920.X.

Japanese Office Action dated Jan. 10, 2017 for Application No. 2015-508956.

Chinese Office Actiond dated Jun. 12, 2017 for Application No. 201380018920.X.

* cited by examiner

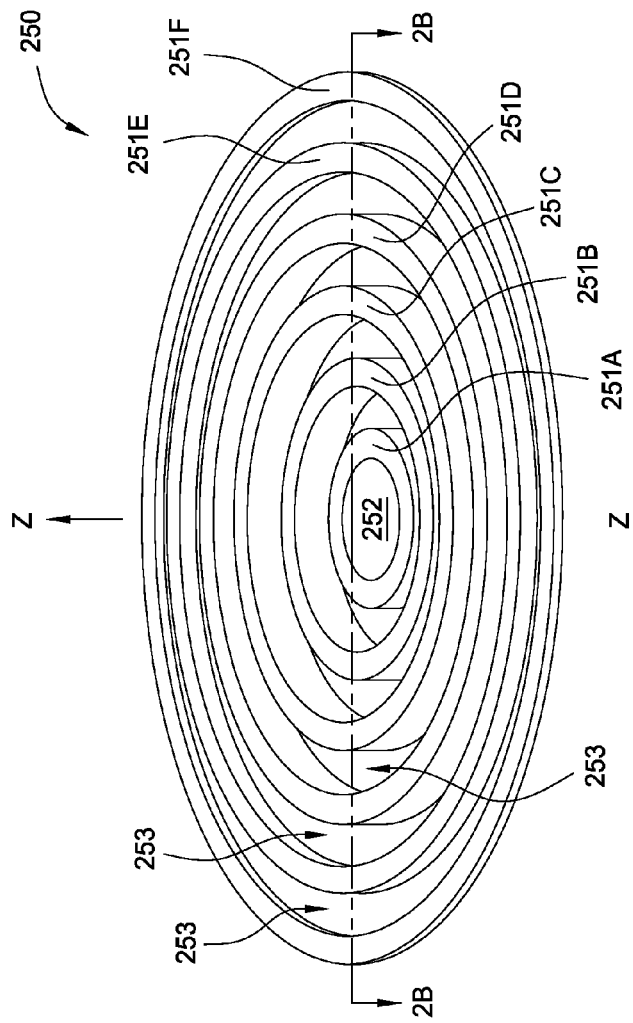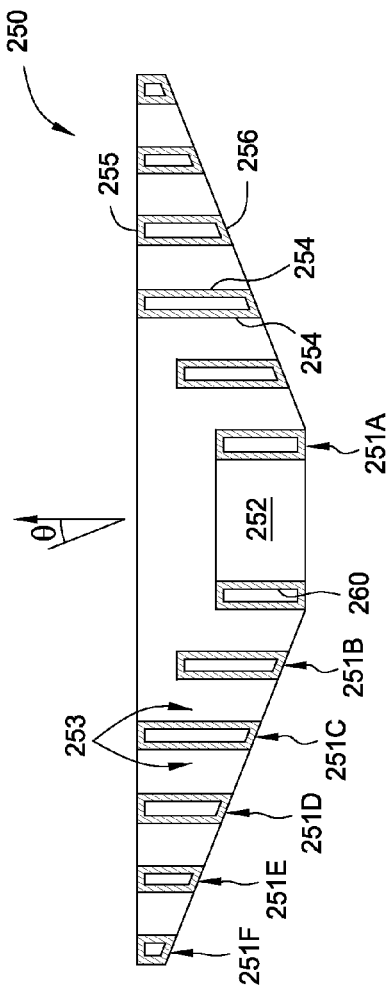
FIG. 2A
FIG. 2B

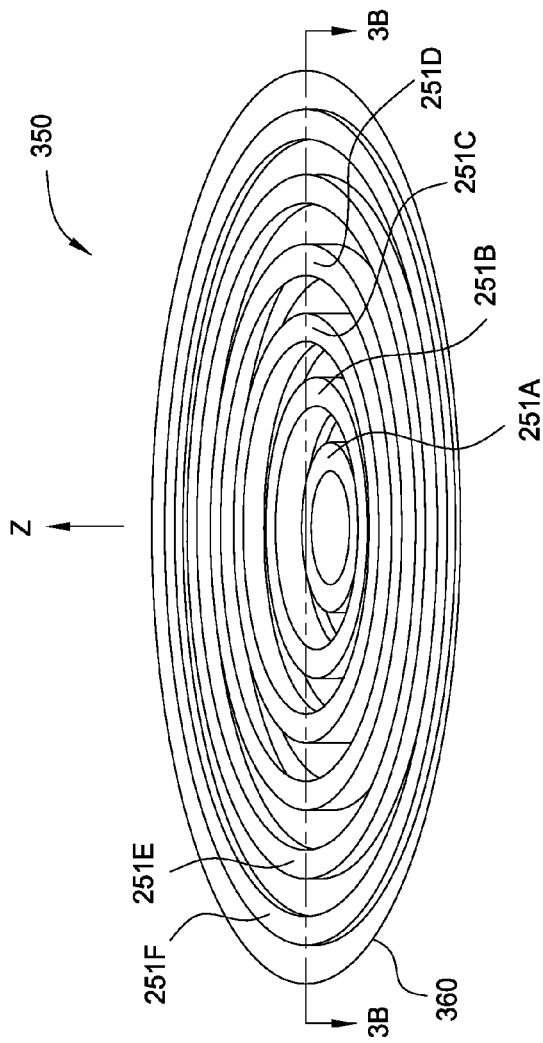
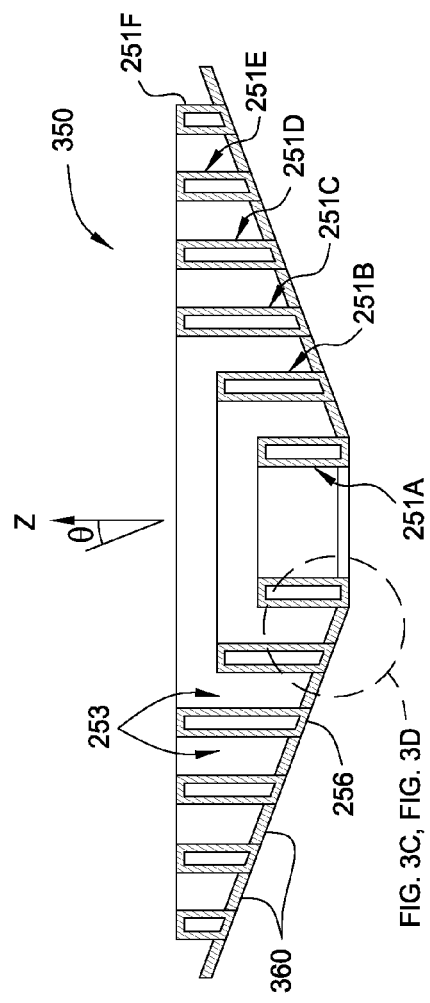
FIG. 3A
FIG. 3B

OPTICS FOR CONTROLLING LIGHT TRANSMITTED THROUGH A CONICAL QUARTZ DOME

CROSS-REFERENCE TO RELATED APPLICATIONS

This application claims benefit of U.S. Provisional Patent Application Ser. No. 61/637,998, filed Apr. 25, 2012, and U.S. Provisional Patent Application Ser. No. 61/662,166, filed Jun. 20, 2012. The aforementioned applications are herein incorporated by reference.

BACKGROUND OF THE INVENTION

Field of the Invention

Embodiments of the present invention generally relate to apparatus for heating substrates, such as semiconductor substrates.

Description of the Related Art

Semiconductor substrates are processed for a wide variety of applications, including the fabrication of integrated devices and microdevices. One method of processing substrates includes depositing a material, such as a dielectric material or a conductive metal, on an upper surface of the substrate. The material may be deposited in a lateral flow chamber by flowing a process gas parallel to the surface of a substrate positioned on a support, and thermally decomposing the process gas to deposit a material from the gas onto the substrate surface. Because a heated substrate facilitates the thermal decomposition of the process gas, it is desirable to have a uniform substrate temperature in order to effect a uniform deposition on the substrate. Non-uniformities in the temperature of the substrate can result in a non-uniform material deposition on the substrate, which ultimately affects the performance of the final manufactured device.

Therefore, there is a need for an apparatus for uniformly heating a substrate.

SUMMARY OF THE INVENTION

Embodiments described herein generally relate to apparatus for heating substrates. The apparatus generally include a process chamber having a substrate support therein. A plurality of lamps is positioned to provide radiant energy through an optically transparent dome to a substrate positioned on the substrate support. A light focusing assembly is positioned within the chamber to influence heating and temperature distribution on the substrate and to facilitate formation of a film on a substrate having uniform properties, such as density. The light focusing assembly can include one or more reflectors, light pipes, or refractive lenses.

In one embodiment, a process chamber comprises a chamber body including an optically transparent dome. A substrate support is disposed within the chamber body. A plurality of lamps is disposed adjacent to the optically transparent dome. A light focusing assembly is positioned within the chamber body between the plurality of lamps and a substrate positioned on the substrate support. The light focusing assembly is adapted to influence radiant energy emitted from the plurality of lamps.

In another embodiment, a process chamber comprises a chamber body including an optically transparent dome. A substrate support is disposed within the chamber body. The substrate support has a support shaft with a hollow cavity therein extending therefrom. A plurality of lamps is disposed adjacent to the optically transparent dome. A light focusing assembly is positioned within the chamber body between the optically transparent dome and the substrate support. The light focusing assembly is in contact with an upper surface of the optically transparent dome and is adapted to influence radiant energy emitted from the plurality of lamps.

In another embodiment, an optical assembly comprises a plurality of concentric rings formed from an optically transparent material. Each concentric ring has a hollow cavity therein. A reflective material is disposed within the hollow cavities of the concentric rings, and a plurality of refractive elements couple adjacent concentric rings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A and 2B are schematic illustrations of a light focusing assembly according to one embodiment of the invention.

FIGS. 3A-3D are schematic illustrations of light focusing assemblies according to other embodiments of the invention.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to apparatus for heating substrates. The apparatus generally include a process chamber having a substrate support therein. A plurality of lamps is positioned to provide radiant energy through an optically transparent dome to a substrate positioned on the substrate support. A light focusing assembly is positioned between the optically transparent dome and the substrate support to influence heating and temperature distribution on the substrate and to facilitate formation of a film on a substrate having uniform properties, such as density. The light focusing assembly can include one or more reflectors, light pipes, or refractive lenses.

Figure 1:
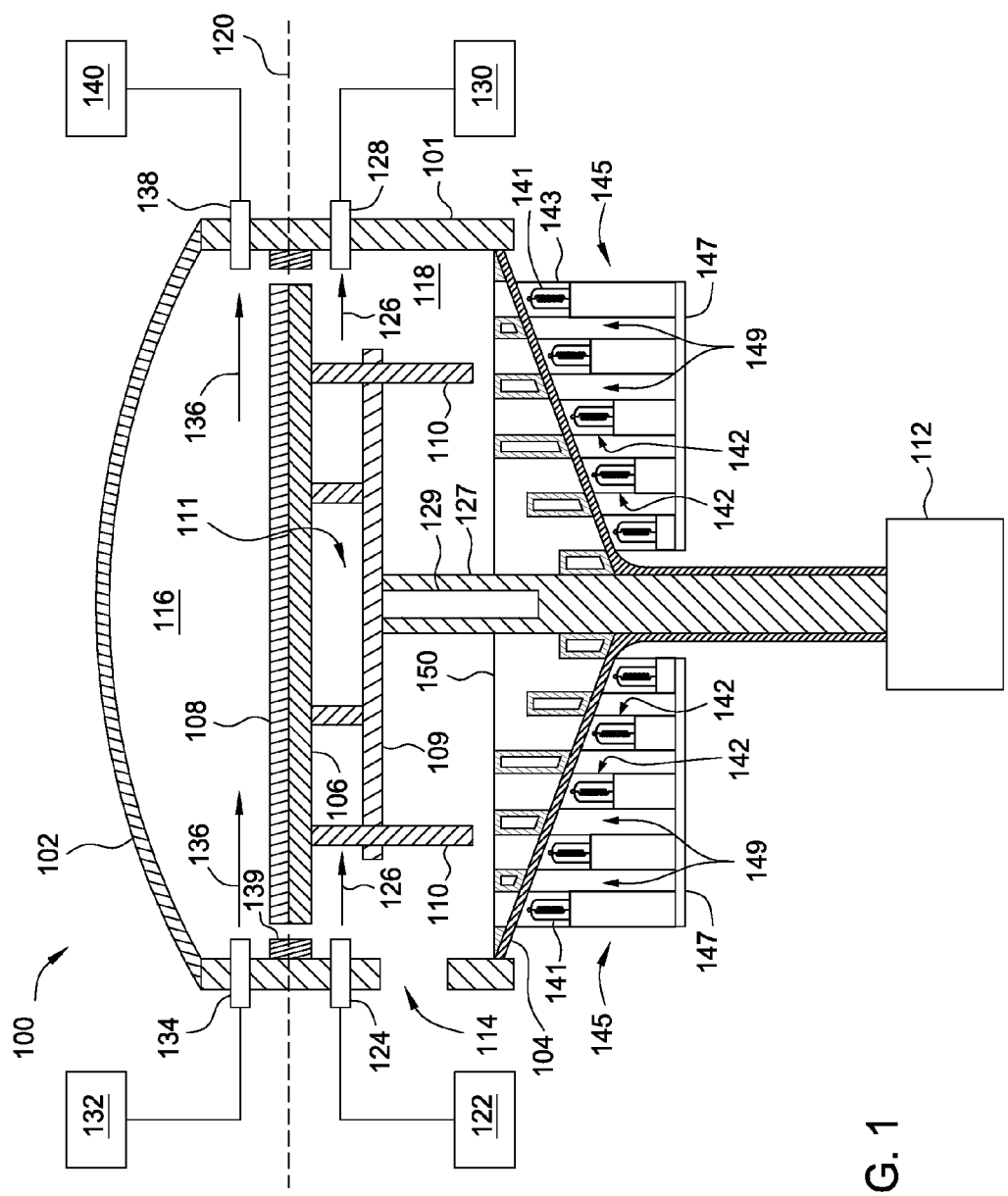
FIG. 1 is a schematic sectional view of a processing chamber according to one embodiment of the invention.

FIG. 1 is a schematic sectional view of a processing chamber 100 according to one embodiment of the invention. The processing chamber 100 may be used to process one or more substrates, including the deposition of a material on an upper surface of a substrate. The processing chamber 100 includes a chamber body 101, an upper dome 102 formed from a material such as a stainless steel, aluminum, ceramics (e.g., quartz), or coated metals or ceramics. The processing chamber 100 also includes a lower dome 104 formed from an optically transparent material such as quartz. The lower dome 104 is coupled to, or is an integral part of, the chamber body 101. A substrate support 106 adapted to support a substrate 108 thereon is disposed within the processing chamber 100 between the upper dome 102 and the lower dome 104. The substrate support 106 is coupled to a support plate 109 and forms a gap 111 therebetween. The support plate 109 is be formed from an optically transparent material, such as quartz, to allow radiant energy from lamps 142 to impinge upon and heat the substrate support 106 to a desired processing temperature. The substrate support 106 is formed from silicon carbide or graphite coated in silicon carbide to absorb radiant energy from the lamps 142 and conduct the radiant energy to the substrate 108.

The substrate support 106 is shown in an elevated processing position, but may be vertically actuated by an actuator 112 to a loading position below the processing position to allow lift pins 110 to contact the lower dome 104 and raise the substrate 108 from the substrate support 106. A robot (not shown) may then enter the processing chamber 100 to engage and remove the substrate 108 therefrom through an opening 114, such as a slit valve. The substrate support 106 is also adapted to be rotated during processing by the actuator 112 to facilitate uniform processing of the substrate 108.

The substrate support 106, while located in the processing position, divides the internal volume of the processing chamber 100 into a process gas region 116 and a purge gas region 118. The process gas region 116 includes the internal chamber volume located between the upper dome 102 and a plane 120 of the substrate support 106 while the substrate support 106 is located in the processing position. The purge gas region 118 includes the internal chamber volume located between the lower dome 104 and the plane 120.

Purge gas supplied from a purge gas source 122 is introduced to the purge gas region 118 through a purge gas inlet 124 formed within a sidewall of the chamber body 101. The purge gas flows laterally along flow path 126 across the back surface of the support 106, and is exhausted from the purge gas region 118 through a purge gas outlet 128 located on the opposite side of the processing chamber 100 as the purge gas inlet 124. An exhaust pump 130, coupled to the purge gas outlet 128, facilitates removal of the purge gas from the purge gas region 118.

Process gas supplied from a process gas supply source 132 is introduced into the process gas region 116 through a process gas inlet 134 formed in a sidewall of the chamber body 101. The process gas flows laterally across the upper surface of the substrate 108 along flow path 136. The process gas exits the process gas region 116 through a process gas outlet 138 located on the opposite side of the processing chamber 100 as the process gas inlet 134. Removal of the process gas through the process gas outlet 138 is facilitated by a vacuum pump 140 coupled thereto.

A plurality of lamps 142 are disposed adjacent to and beneath the lower dome 104 to heat the substrate 108 as the process gas passes thereover to facilitate the deposition of a material onto the upper surface of the substrate 108. The lamps include bulbs 141 surrounded by an optional reflector 143. Each lamp 142 is coupled to a power distribution board 147 through which power is supplied to each lamp 142. The lamps 142 are arranged in annular groups of increasing radius around a shaft 127 of the substrate support 106. The shaft 127 is formed form quartz and contains a hollow portion or cavity 129 therein, which reduces lateral displacement of radiant energy near the center of the substrate 108, thus facilitating uniform irradiation of the substrate 108.

The lamps 142 are adapted to the heat the substrate to a predetermined temperature to facilitate thermal decomposition of the process gas onto the surface of the substrate 108. In one example, the material deposited onto the substrate may be a group III, group IV, and/or group V material, or may be a material including a group III, group IV, and/or group V dopant. For example, the deposited material may include gallium arsenide, gallium nitride, or aluminum gallium nitride. The lamps may be adapted to heat the substrate to a temperature within a range of about 300 degrees Celsius to about 1200 degrees Celsius, such as about 300 degrees Celsius to about 950 degrees Celsius. Radiant energy from the lamps 142 is directed to the substrate support 106 by a light focusing assembly 150 to controllably heat the substrate 108, thus resulting in a more uniform deposition on the substrate 108. The uniform deposition on the substrate 108 results in a higher quality substrate and a more efficient manufactured device. The light focusing assembly 150 is positioned above and in contact with the lower dome 104, adjacent to the purge gas region 118. Thus, the light focusing assembly 150 is located within an internal volume of the processing chamber 100.

One or more lamps 142 are positioned within a lamphead 145 which may be cooled during or after processing by a cooling fluid introduced into channels 149 located between the lamps 142. The lamphead 145 conductively cools the lower dome 104 due in part to the close proximity of the lamphead 145 to the lower dome 104. The lamphead 145 also cools the lamp walls and walls of the reflectors 143 as well.

Although FIG. 1 illustrates one embodiment of a processing chamber, additional embodiments are also contemplated. For example, in another embodiment, it is contemplated that the substrate support 106 may be formed from an optically transparent material, such as quartz, to allow for direct heating of the substrate 108. In yet another embodiment, it is contemplated that an optional circular shield 139 may be disposed around the substrate support 106 and coupled to a sidewall of the chamber body 101. In another embodiment, the process gas supply source 132 may be adapted to supply multiple types of process gases, for example, a group III precursor gas and a group V precursor gas. The multiple process gases may be introduced into the chamber through the same process gas inlet 134, or through different process gas inlets 134. Additionally, it is also contemplated that the size, width, and/or number of gas inlets 124, 134, or gas outlets 128, 138 may be adjusted to further facilitate a uniform deposition of material on the substrate 108. In yet another embodiment, it is contemplated that the lampheads 145 are not in contact with the lower dome 104. In another embodiment, the substrate support 106 may be an annular ring or edge ring having a central opening therethrough, and may be adapted to support the perimeter of the substrate 108. In such an embodiment, the substrate support 106 may be formed from silicon carbide, silicon-carbide-coated graphite, or glassy-carbon-coated graphite.

FIGS. 2A and 2B are schematic illustrations of the light focusing assembly 250 according to one embodiment of the invention. FIG. 2A illustrates a perspective view of the light focusing assembly 250. FIG. 2B illustrates a sectional view of the light focusing assembly 250 along the section line 2B-2B. The light focusing assembly 250 is similar to and may be used in place of the light focusing assembly 150. The light focusing assembly 250 includes a plurality of concentric rings 251A-251F of increasing diameter. The rings 251A-251F are adapted to increase light collimation, homogenization, and/or substrate illumination uniformity. The centermost ring 251A includes an opening 252 therein to accommodate a support shaft of a substrate support. A gap 253 is disposed between adjacent vertical surfaces of each of the rings 251A-251F to allow radiant energy from heat lamps to pass between the rings 251A-251F and heat a substrate during processing. Generally, each gap 253 corresponds to one ring or zone of lamps within a process chamber. It is to be noted that the size and number of gaps 253 can be adjusted depending on the size and number of lamps utilized within a process chamber.

The rings 251A-251F are hollow rings or dewars formed from quartz or other optically transparent material and have a reflective material disposed on internal surfaces 260 of a hollow cavity formed therein. For example, the internal surfaces 260 may have an aluminum, silver, gold or other reflective coating thereon to reflect radiant energy such as light towards a substrate in a predetermined manner to facilitate uniform heating of a substrate. Placement of the reflective material within the rings 251A-251F protects the reflective material from cleaning gases utilized during cleaning processes. The rings 251A-251F have two outer vertical surfaces 254, each or which are parallel to one another, and a top surface 255 which is perpendicular to the vertical surfaces 254. The top surface 255 is generally positioned parallel to a substrate within a process chamber. A bottom surface 256 of each ring 251A-251F is positioned at an angle with respect to the upper surface 255. The angle of the bottom surfaces 256 is selected to match the angle of a lower dome within a process chamber to facilitate contact between the bottom surfaces 256 and a lower dome. It is to be noted that the top surfaces 255 of the two innermost rings 251A and 251B are disposed below the plane of the top surfaces 255 of the remaining rings 251C-251F. It is believed that the reduced height of the innermost rings 251A and 251B facilitates more uniform heating of the substrate by providing a more uniform irradiation of the center of the substrate support and/or substrate. However, it is contemplated that the upper surfaces of rings 251A and 251B may be coplanar with the upper surfaces of rings 251C-251F in some embodiments.

The rings 251A-251F may have a thickness within a range from about 2.5 millimeters to about 35 millimeters, for example, about 2.5 millimeters to about 5 millimeters, or about 25 millimeters to about 35 millimeters. In one example, the rings 251A-251F may have walls with a thickness of about 1 millimeter each. In such an example, the rings 251A-251F may have cavities therein with a width of about 0.5 millimeters to about 33 millimeters, such as about 0.5 millimeters to about 3 millimeters, or about 23 millimeters to about 33 millimeters. In embodiments where the cavity has a width greater than about 5 millimeters, the upper surface of the cavity may also be coated with a reflective material. The reflective material on the upper surface of the cavity reflects any radiant energy not absorbed by the substrate support 106 back towards the substrate support 106, thus enhancing process efficiency. Additionally, as the width of each of the rings 251A-251F increases, the gap 253 therebetween decreases. The decreasing gap size reduces the amount of radiant energy that can reenter the gaps 253 (e.g., by downward reflection from a substrate or substrate support, or by direct thermal radiation from the substrate or substrate support) by reducing the angle at which light is permitted to enter the gap 253. Such radiant energy which enters the gap 253 may reduce process efficiency.

As shown in FIG. 2B, the light focusing assembly 250 generally has a conical cross-section, with the height of each ring increasing as the radii of the rings decrease. However, as noted above, in some embodiments, the inner most rings 251A and optionally 251B may have reduced height in order to promote uniform irradiation near the center of a substrate support. In another embodiment, it is contemplated the top surfaces of rings 251A-251F may all be coplanar. In such an embodiment, the innermost ring 251A would have the greatest height.

FIGS. 2A and 2B illustrates one embodiment of light focusing assembly, however, other embodiments are also contemplated. In another embodiment, it is contemplated that the rings 251A-251F may be solid, and the reflective material may be disposed on the outside of the rings 251A-251F. In such an embodiment, the reflective material may be covered with a protective dielectric coating, such as silicon dioxide, to protect the reflective material from corrosive cleaning gases. In yet another embodiment, it is contemplated that the internal surfaces 260 of the rings 251A-251F may not be covered in a reflective material. Instead, a reflective element, such as aluminum foil, may be positioned within the cavity formed within each of the rings 251A-251F. In yet another embodiment, it is contemplated that one or both of the vertical surfaces 254 or internal surfaces 260 may be disposed at an angle theta with respect to the Z axis. The angle theta may be within a range from about −20 degrees to about 20 degrees, and need not be the same for each of the vertical surfaces 254 or internal surface 260.

Figure 3C:
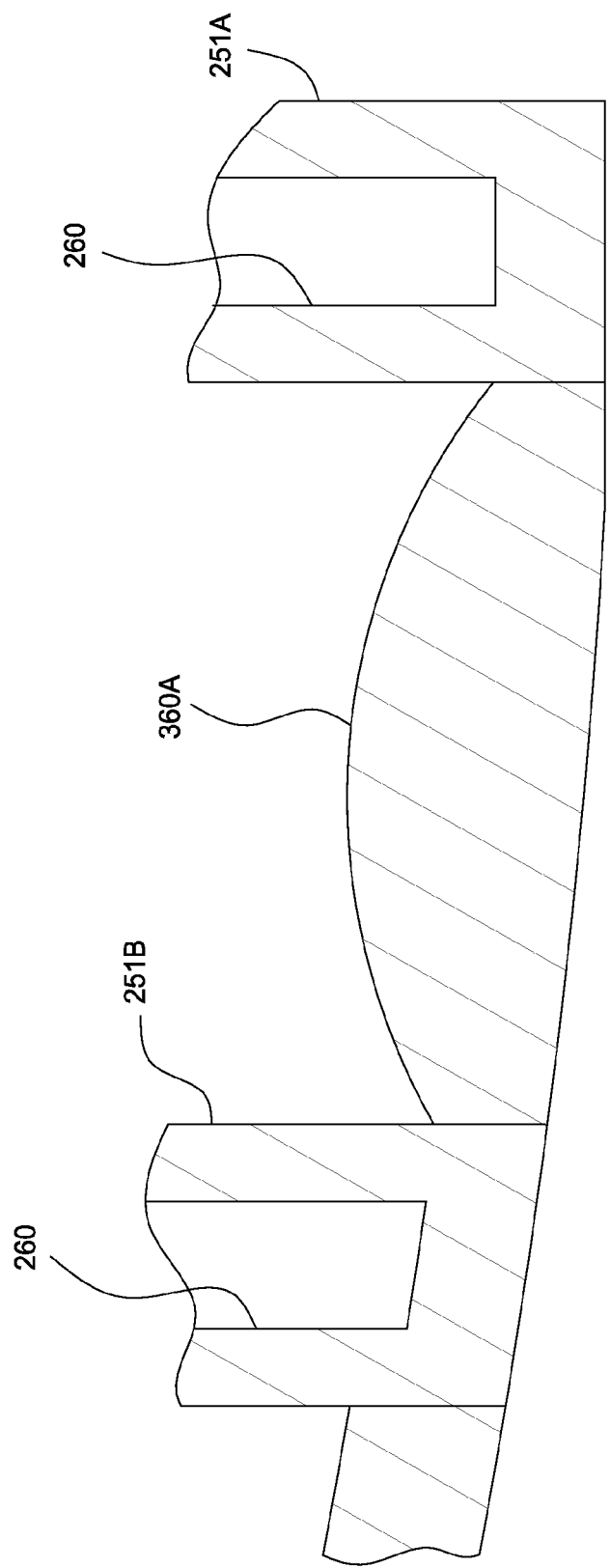

FIGS. 3A-3D are schematic illustrations of light focusing assemblies according to other embodiments of the invention. FIG. 3A illustrates a top perspective view of a light focusing assembly 350. The light focusing assembly 350 is similar to the light focusing assembly 250, except that the light focusing assembly 350 includes refractive elements 360 coupled to the lower portions of rings 251A-251F. The refractive elements 360 are convex, concave, linear, Fresnel, or other lenses, formed from an optically transparent material such as quartz. The refractive elements 360, in combination with the reflective properties of the rings 251A-251F, are adapted to increase light collimation, homogenization, and/or substrate illumination uniformity. The lower surfaces of each of the refractive elements 360 is linear and coplanar with the lower surfaces 256 of the rings 251A-251F, thus facilitating mating of the light focusing assembly 350 to a lower dome in a process chamber.

FIG. 3B illustrates a sectional view of the light focusing assembly 350 along the section line 3B-3B. The refractive elements 360 are coupled to the lower vertical edges of the rings 251A-251F, and couple the rings 251A-251F to one another, thus increasing the rigidity of the light focusing assembly 350. In another embodiment, it is contemplated that the refractive elements 360 may form a conical unitary piece similar in size and shape to a lower dome of a process chamber. In such an embodiment, the rings are coupled to the upper surface of the unitary piece, which can then be positioned on or above the lower dome of a process chamber. In yet another embodiment, it is contemplated that the refractive elements may be coupled directly to a lower dome within a process chamber, or formed as an integral part of a lower dome. In another embodiment, it is contemplated that the refractive elements 360 may be separate and individually replaceable.

FIG. 3C illustrates an enlarged schematic view of a portion of the light focusing assembly 350 according to one embodiment. FIG. 3C illustrates a refractive element 360A positioned between and in contact with rings 251A and 251B. The refractive element 360A is a convex lens which facilitates collimation and homogenization of radiant energy emitted from lamps positioned proximate to the refractive element 360A. The refractive element 360A is shown having a convex shape; however, other shapes, including concave or linear, are also contemplated.

Figure 3D:
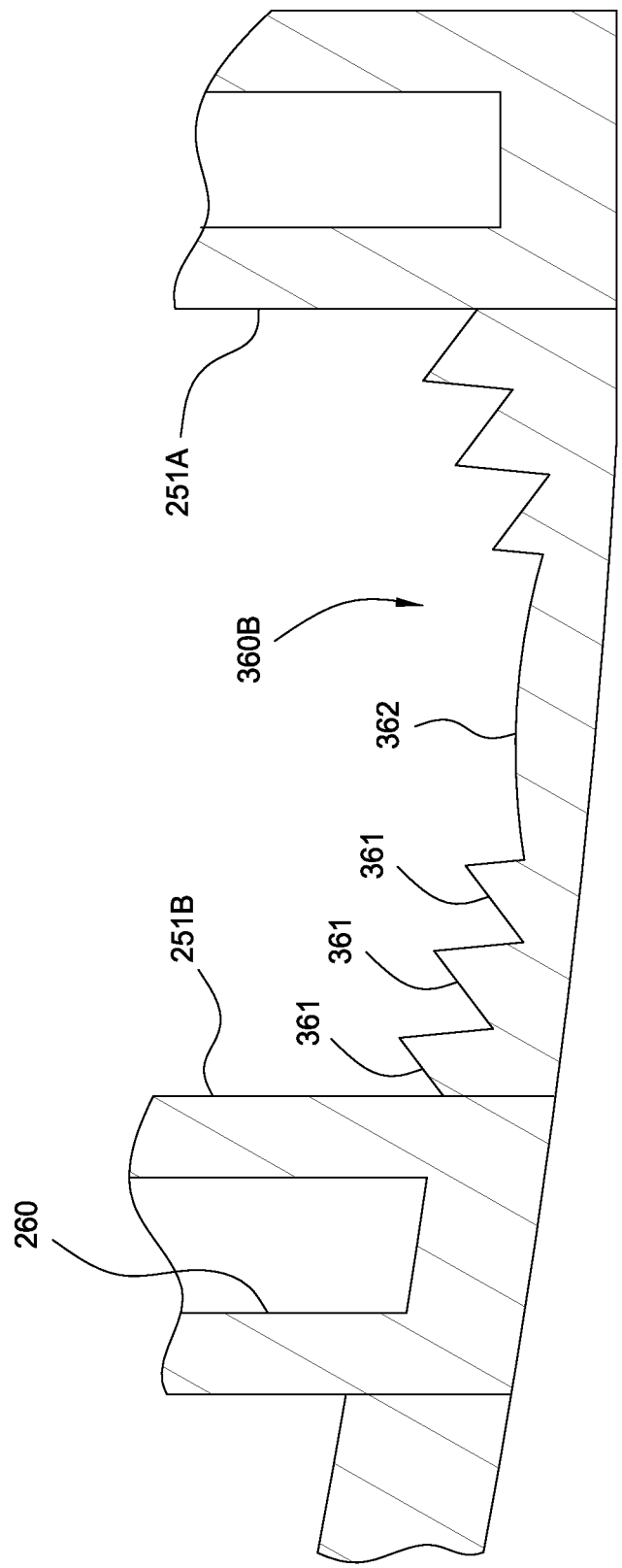

FIG. 3D illustrates an enlarged schematic view of a portion of the light focusing assembly 350 according to another embodiment. The refractive element 360B illustrated in FIG. 3D is a Fresnel lens, which reduces the amount or material required to form the lens compared to a conventional lens, such as the refractive element 360A illustrated in FIG. 3C. The use of the refractive element 360B reduces the weight of the light focusing assembly 350. The refractive element 360A includes a plurality of concentric annular sections 361, or Fresnel zones, surrounding a convex lens 362. It is to be noted that the design of the refractive element 360B is exemplary, and other lens designs are contemplated, such as diffusive optics.

In another embodiment, it is contemplated that the refractive elements 360A and/or 360B may be coupled to the support plate 109 of FIG. 1, and thus are actuated with the substrate support 106. In such an embodiment, the light focusing assembly 350 may be excluded, thereby simplifying the design of the processing chamber 100 and reducing the production cost of processing chamber 100. Furthermore, since the light focusing assembly 350 could be excluded, the thickness of the lower dome 104 could be reduced since the lower dome 104 would no longer need to provide support for the light focusing assembly 350. The decrease in thickness of the lower dome 104 further reduces manufacturing costs. In yet another embodiment, it is contemplated that the refractive elements 360A and/or 360B may be positioned on the lower dome 104, and the concentric rings 251A-251F may be excluded. In such an embodiment, the absence of the concentric rings results in reduced production costs.

Figure 4:
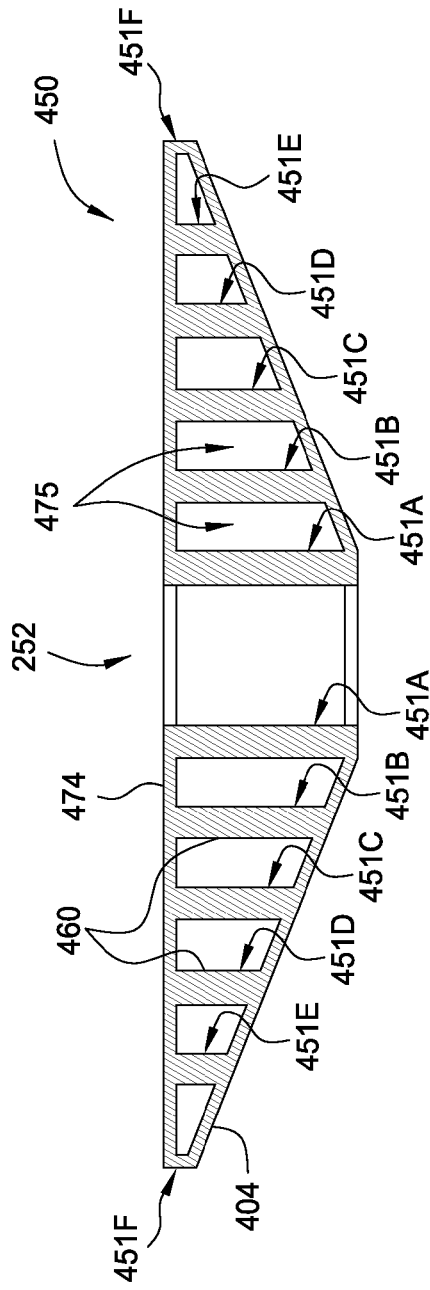
FIG. 4 illustrates a light focusing assembly according to another embodiment of the invention.

FIG. 4 illustrates a light focusing assembly 450 according to another embodiment of the invention. The light focusing assembly 450 includes concentric rings 451A-451F disposed between and coupled to an optically transparent lower plate 404 and an optically transparent upper plate 474. The optically transparent lower plate 404 is sized and shaped to be positioned on a lower dome, such as the lower dome 104 shown in FIG. 1. The optically transparent lower plate 404 may be coupled to the lower dome 104 by an adhesive or by interlocking pieces. The optically transparent upper plate 474 is coupled to the concentric rings 451A-451F opposite the optically transparent lower plate 404. The concentric rings 451A-451F, the optically transparent lower plate 404, and the optically transparent upper plate 474 may be machined from a unitary block of material, such as quartz, or may be constructed individually and then assembled. The concentric rings 451A-451F, the lower dome 104, and the optically transparent upper plate 474 are positioned to form gaps 475 between each of the concentric rings 451A-451F. The gaps 475 are positioned over lamps within a processing chamber, such as processing chamber 100 shown in FIG. 1. The gaps 475 are generally evacuated to form a vacuum therein.

The internal surfaces 460 of each gap 475 (e.g., the surfaces of the concentric rings 451A-451F) are coated with a reflective material to enhance illumination control. Thus, a hollow cavity within each concentric ring 451A-451F need not be formed and coated. Such an embodiment simplifies production and repair of reflectively-coated surfaces. Because each gap 475 is a sealed enclosure, the reflective material therein is protected from process and cleaning gases.

The surfaces 460 of the concentric rings 451A-451F may be coated by forming an opening within the optically transparent lower plate 404 or the optically transparent upper plate 474, and introducing a reflective material, such as a liquid which is subsequently dried, into each gap 475. Undesired reflective material may be removed, for example, by etching. Additionally or alternatively, the undesired deposition of reflective material can be reduced or prevented by masking surfaces upon which deposition is not desired. In yet another embodiment, for example, when constructing the light focusing assembly 450 from individual components, the reflective material may be deposited on the surfaces 460 prior to assembly. In such an embodiment, deposition, masking, and/or etching may be simplified. It should be noted that application of reflective material to the concentric rings 251A-251F (shown in FIGS. 2A, 2B, 3A, and 3B) may be performed in a similar manner.

FIG. 4 illustrates one embodiment of a light focusing assembly 450, although other embodiments are also contemplated. For example, it is contemplated that the concentric rings 451A-451F may be formed from a metal or other reflective material, rather than an optically transparent material coated with a reflective material. For example, the concentric rings 451A-451F may be formed from silver, gold, copper, aluminum, or combinations thereof. In some instances, the fabrication of the the concentric rings 451A-451F form a metal rather than quartz may require less manufacturing steps and may reduce manufacturing costs. Additionally, repair and replacement of the concentric rings 451A-451F may be simplified.

Figure 5:
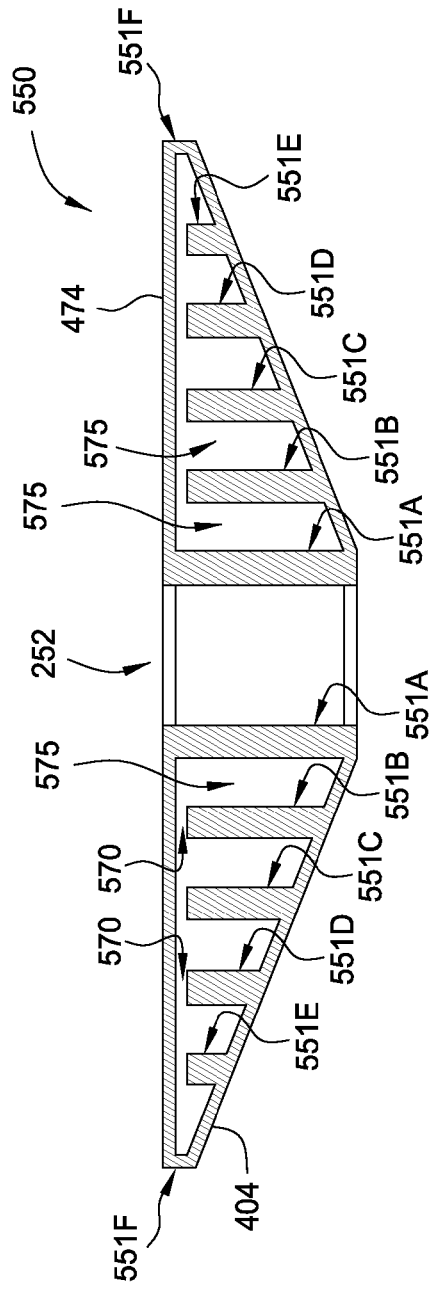
FIG. 5 illustrates a light focusing assembly according to another embodiment of the invention.

FIG. 5 illustrates a light focusing assembly 550 according to another embodiment of the invention. The light focusing assembly 550 is similar to the light focusing assembly 450; however, the optically transparent upper plate 474 does not contact all of the concentric rings 451A-451F due to the spaces 570. Thus, the gaps 575 are in fluid communication. Such an embodiment simplifies evacuation of the gap 575, as well as application of reflective material. Additionally, the spaces 570 provide a break in the thermal conduction path between the optically transparent lower plate 404 and the optically transparent upper plate 474, thereby reducing the conductive heat flow from the upper plate 474 to the lower plate 404 and consequently the lower chamber done 104 (shown in FIG. 1). Because excess heat is removed from the optically transparent lower plate 404 and the lower chamber dome 104 via cooling channels disposed in the lampheads 145 (shown in FIG. 1) as discussed above, the reduction in conductive heat flow results in either reduced lower dome temperatures, or if the lower dome temperature is required to have a minimum value, a reduced coolant flow in the lamphead.

FIG. 5 illustrates one embodiment of a light focusing assembly 550, but other embodiments are also contemplated. For example, it is contemplated that the optically transparent upper plate 474 may contact some or all of the concentric rings 551A-551E at discrete points via extension of the concentric rings 551A-551E. Contact between the concentric rings 551A-551E and the optically transparent upper plate 474 increases the structural rigidity of the light focusing assembly 550. In such an embodiment, some spaces 570 remain so as to maintain the fluid communication of the gaps 575. In another embodiment, it is contemplated that cross rods formed from an optically transparent material may be positioned between adjacent concentric rings 551A-551F to increase the structural rigidity of the light focusing assembly 550.

Figure 6:
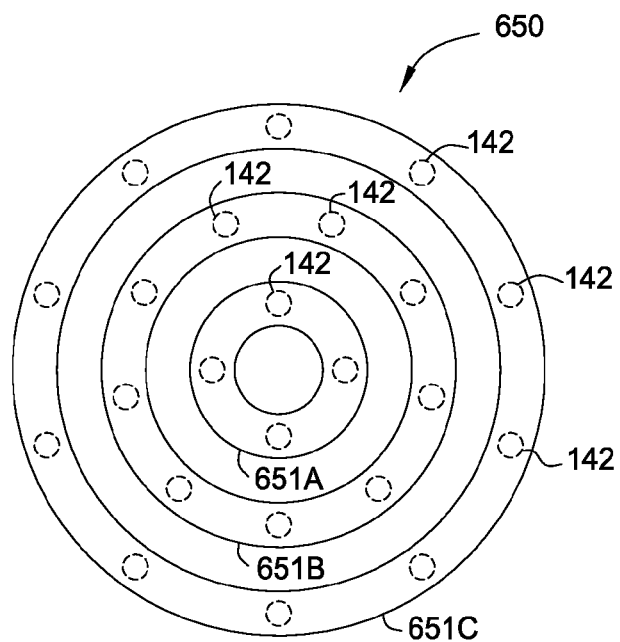
FIG. 6 illustrates a light focusing assembly according to another embodiment of the invention.

FIG. 6 illustrates a light focusing assembly 650 according to another embodiment of the invention. The light focusing assembly 650 includes a plurality of concentric rings 651A-651C. While three concentric rings are shown, it is contemplated that more or less concentric rings may be includes, for example, one concentric ring per ring of lamps in a processing chamber. The concentric rings 651A-651C are formed from an optically transparent material, such as quartz, and are positioned over lamps 142. In such an embodiment, the concentric rings 651A-651C function as refractive elements to influence irradiance from the lamps 142 and to facilitate uniform processing of substrates. The concentric rings 651A-651C reduce the diffusion of the light from the lamps 142, thereby reducing the cross-coupling of irradiation from lamps 142 on a substrate, particularly between radial arrays of lamps.

Figure 7:
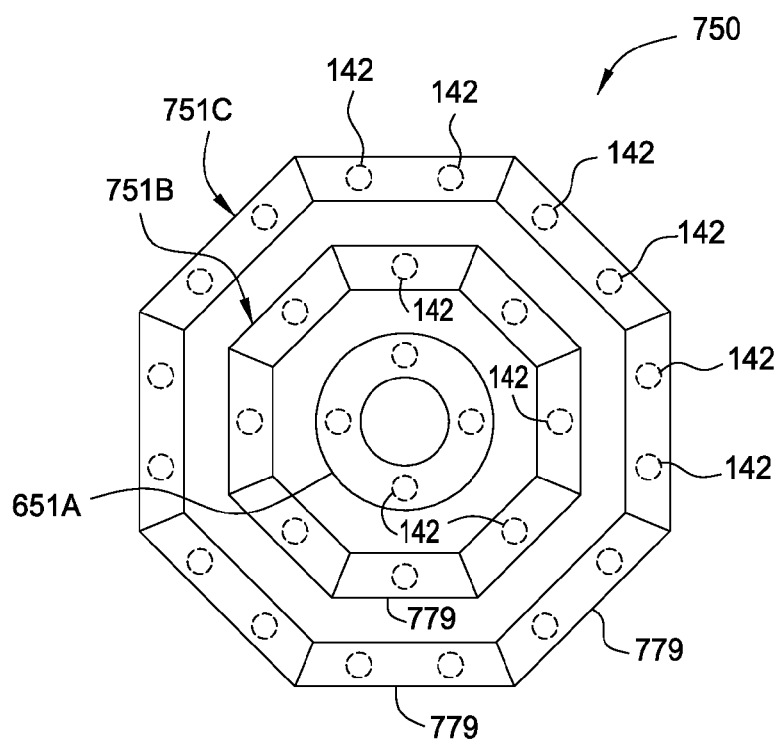
FIG. 7 illustrates a light focusing assembly according to another embodiment of the invention.

FIG. 7 illustrates a light focusing assembly 750 according to another embodiment of the invention. The light focusing assembly 750 is similar to the light focusing assembly 650, except the light focusing assembly includes concentric rings 751B and 751C which are polygonal approximations of concentric rings. The concentric rings 751B and 751C are composed of discrete polygons 779 which are sized, shaped, and assembled to approximate a ring. Each concentric ring 751B and 751C is composed of multiple polygons 779, and it is contemplated that the number of polygons 779 in each ring may be more or less than is shown. The use of polygons 779, rather than perfect rings, increases the mixing of light from the lamps 142 resulting in a more reproducible irradiation profile by rendering the resultant irradiation profile less dependent on individual lamp characteristics. In some instances, the use of polygons 779 may improve the distribution profile of the lamps 142.

Each ring need not include the same number of polygons 779, and thus, not the same number of facets. Additionally, while the polygons 779 are illustrates as being disposed over one or two lamps 142, it is contemplated that each polygon 779 may be positioned over any number lamps 142. It is contemplated that adjacent polygons 779 may be in contact, or a gap may be positioned therebetween to increase the total internal reflection by the creation of the additional surfaces. The adjacent surfaces of adjacent polygons 779 may be transparent, or may be coated with a reflective material.

Figure 8A:
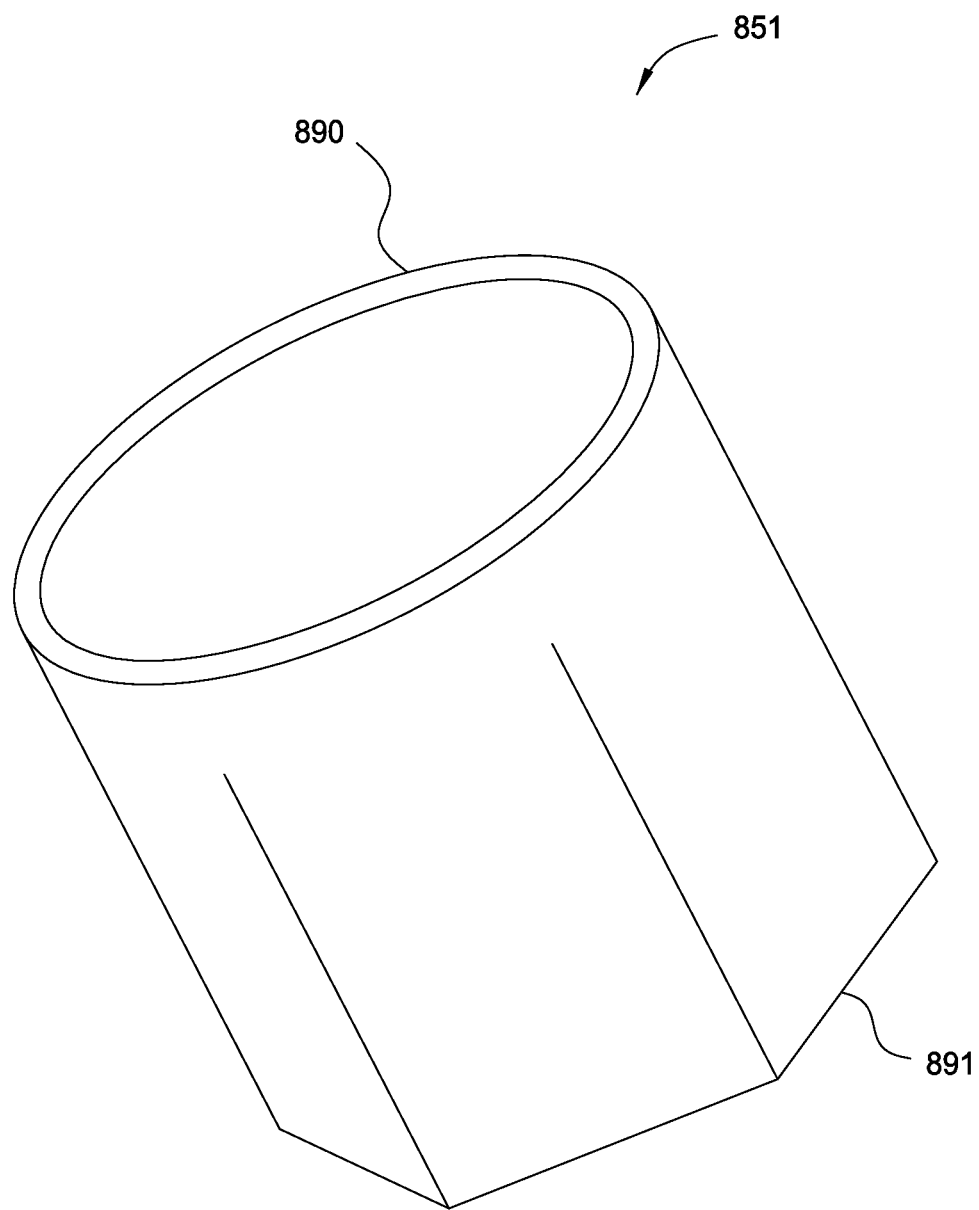
FIGS. 8A and 8B are perspective views of a ring according to one embodiment of the invention.
Figure 8B:
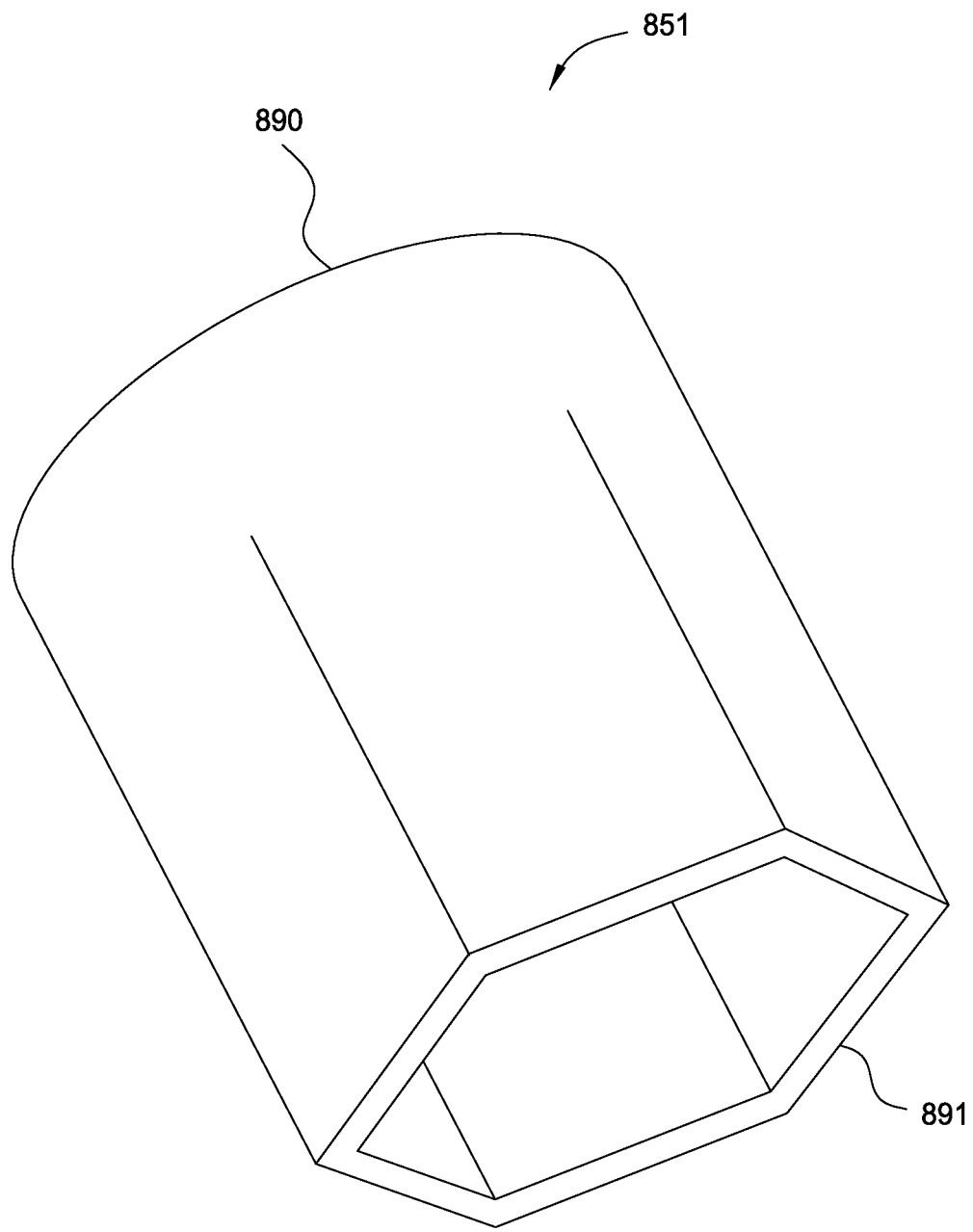

FIGS. 8A and 8B illustrate perspective views of a ring 851 according to one embodiment of the invention. The ring 851 may be utilized in any of the embodiments described herein, for example, as a ring 251A, 451A, 651A or 751A. The ring 851 includes a first face 890 which is circular, and a second face 891 which is polygonal. The ring 851 includes an opening disposed centrally therethrough. The number of polygonal facets may be adjusted to facilitate the desired amount of light mixing. It is contemplated that the surfaces of each of the first face 890 and the second face 891 may be shaped to include specific refractive elements thereon, such as concave or convex lenses. The sidewalls of the ring 851 connecting the first face 890 and the second face 890 are generally parallel, however, non-parallel embodiments are also contemplated. The ring 851 may be positioned within a process chamber wither either the first face 809 or the second face 891 positioned towards one or more lamps.

While numerous reflective and refractive elements are described herein, it is contemplated that any of the reflective or refractive elements may be utilized alone or in combination with one another.

Benefits of the present invention include increased collimation and homogenization of radiant energy within a process chamber. The increased collimation and homogenization result in more controlled heating of substrates, which in turn, results in a more uniform deposition profile and material properties on the substrates. The uniform deposition profile on the substrates results in high quality and more efficient manufactured devices.

While the foregoing is directed to embodiments of the present invention, other and further embodiments of the invention may be devised without departing from the basic scope thereof, and the scope thereof is determined by the claims that follow.

What is claimed is:

1. A process chamber, comprising:
 a chamber body including an optically transparent dome;
 a substrate support disposed within the chamber body;
 a plurality of lamps disposed adjacent to the optically transparent dome; and
 a light focusing assembly positioned within the chamber body between the plurality of lamps and a substrate positioned on the substrate support, the light focusing assembly adapted to influence radiant energy emitted from the plurality of lamps, wherein:
  the light focusing assembly comprises a plurality of concentric rings or polygonal approximations to rings, the concentric rings or the polygonal approximations to rings comprising quartz; and
  the concentric rings or the polygonal approximations to rings contain a hollow cavity therein, and interior walls of the hollow cavity having a reflective coating thereon.

2. The process chamber of claim 1, wherein at least some of the concentric rings have different heights.

3. The process chamber of claim 1, wherein the reflective coating comprises silver, gold, or aluminum.

4. The process chamber of claim 1, wherein the concentric rings each have a thickness within a range of about 2.5 millimeters to about 35 millimeters.

5. The process chamber of claim 1, wherein a support shaft coupled to the substrate support is disposed through a center of an innermost ring of the plurality of concentric rings.

6. The process chamber or claim 5, wherein the support shaft is formed form quartz and contains a hollow cavity therein.

7. The process chamber of claim 1, wherein the light focusing assembly further comprises a plurality of refractive elements disposed between adjacent concentric rings.

8. The process chamber of claim 7, wherein the refractive elements include convex or concave lenses.

9. The process chamber of claim 7, wherein the refractive elements include Fresnel lenses.

10. The process chamber of claim 1, wherein the lamps are positioned outside of a processing region of the chamber body.

11. A process chamber, comprising:
 a chamber body including an optically transparent dome;
 a substrate support disposed within the chamber body, the substrate support having a support shaft extending therefrom;
 a plurality of lamps disposed adjacent to the optically transparent dome; and a light focusing assembly positioned within the chamber body between the optically transparent dome and the substrate support, the light focusing assembly in contact with an upper surface of the optically transparent dome and adapted to influence radiant energy emitted from the plurality of lamps wherein:
the light focusing assembly comprises a plurality of concentric rings or polygonal approximations to rings, the concentric rings or the polygonal approximations to rings comprising quartz; and
the concentric rings or the polygonal approximations to rings contain a hollow cavity therein, and interior walls of the hollow cavity having a reflective coating thereon.

12. The process chamber of claim 11, wherein the support shaft includes a hollow cavity therein.

13. The process chamber of claim 12, wherein the light focusing assembly further comprises a plurality of refractive elements disposed between adjacent concentric rings.

14. The process chamber of claim 13, wherein the refractive element comprises a concave, convex, or Fresnel lenses.

* * * * *